(12) United States Patent
Lin et al.

(10) Patent No.: US 8,952,398 B2
(45) Date of Patent: Feb. 10, 2015

(54) LED LIGHTING MODULE

(71) Applicant: Lextar Electronics Corporation, Hsinchu (TW)

(72) Inventors: Jian-Jhih Lin, Hualien (TW); Yi-Ching Wang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/064,593

(22) Filed: Oct. 28, 2013

(65) Prior Publication Data
US 2014/0327021 A1 Nov. 6, 2014

(30) Foreign Application Priority Data
May 2, 2013 (TW) .............................. 102115735 A

(51) Int. Cl.
H01L 33/00 (2010.01)
H01L 25/075 (2006.01)

(52) U.S. Cl.
CPC ................................. *H01L 25/0753* (2013.01)
USPC ............................................... 257/88; 257/90

(58) Field of Classification Search
CPC ................ H01L 25/167; H01L 27/153; H01L 2924/1204
USPC .................. 257/88, 90, 95, 99, 676, E25.032
See application file for complete search history.

(56) References Cited

U.S. PATENT DOCUMENTS

2011/0222277 A1* 9/2011 Negley et al. .................. 362/235
2013/0141891 A1* 6/2013 Funakubo ....................... 362/84

* cited by examiner

*Primary Examiner* — Brook Kebede
(74) *Attorney, Agent, or Firm* — Moser Taboada

(57) ABSTRACT

An LED lighting module includes a support board with a first LED and a second LED thereon. The wavelength of light emitted by the first LED is different from that of light emitted by the second LED. The height of the first LED is different from that of the second LED for preventing the emitting light of the first LED absorbed by the wavelength conversion layer of the second LED.

13 Claims, 6 Drawing Sheets

LED LIGHTING MODULE

RELATED APPLICATIONS

The present application is based on, and claims priority from, Taiwan Application Serial Number 102115735, filed on May 2, 2013, the disclosure of which is hereby incorporated by reference herein in its entirety.

BACKGROUND

1. Field of Invention

The present invention relates to an LED lighting module. More particularly, the present invention relates to an LED lighting module equipped with two kinds of LEDs with different thicknesses and emitting different wavelength lights.

2. Description of Related Art

Since the light emitting diodes are equipped with advantages of small size, low power consumption and long lifetime etc., they have been gradually applied in a variety of lighting products, such as car headlights, street lights, traffic lights, general lighting, and even applied in a special landscape lighting and display backlight modules.

Traditionally, a mature manufacturing method of white light emitting diode is based upon a blue light-emitting diode with a yellow phosphor to produce white light, e.g., using the yellow-yttrium aluminum garnet (YAG) phosphor with blue LED chip to produce white light. However, since the luminous efficiency of the YAG phosphor powder decreases with increasing temperature, the generated white light has poor color rendering due to lacking the red light spectrum. Another white LED manufacturing method is based upon a blue LED chip with green phosphors and red phosphors to produce green and red light so as to generate a hybrid white of mixing the remaining blue light with green and red light. This LED manufacturing method is to have red and green phosphors mixed together in encapsulant materials, thereby causing the red phosphors to absorb not only the blue lights but also absorb the green lights generated by green phosphors and convert into red lights (also referred as "light absorbance interference". Therefore, the latter LED manufacturing method reduces the amount of green lights, thereby affecting the quality of the final white lights.

For the forgoing reasons, there is a need for a better LED structure or mechanism to overcome the shortcomings in the prior art.

SUMMARY

It is therefore an objective of the present invention to provide an LED lighting module equipped with two kinds of LEDs with different thicknesses and emitting different wavelength lights so as to deal with the problems in the prior art.

In accordance with the foregoing and other objectives of the present invention, a LED lighting module includes a support board, a first light emitting diode and a second light emitting diode. The support board has an upper surface and a lower surface opposite to the upper surface. The first light emitting diode is located on an upper surface of the support board. The first light emitting diode includes a first substrate, a first light emitting layer stack and a first wavelength-converting layer. The first light emitting layer stack is located on the first substrate and configured to emit a first wavelength light. The first wavelength-converting layer is located on the first light emitting layer stack and configured to absorb part of the first wavelength light and convert into a second wavelength light. The second light emitting diode is located on the upper surface of the support board. The second light emitting diode includes a second substrate, a second light emitting layer stack and a second wavelength-converting layer. The second light emitting layer stack is located on the second substrate and configured to emit a third wavelength light. The second wavelength-converting layer is located on the second light emitting layer stack and configured to absorb part of the third wavelength light and convert into a fourth wavelength light. The first light emitting diode and the second light emitting diode are of different thicknesses.

According to another embodiment disclosed herein, the second wavelength light has a longer wavelength than the first wavelength light has, the fourth wavelength light has a longer wavelength than the third wavelength light has, and the fourth wavelength light has a longer wavelength than the second wavelength light has.

According to another embodiment disclosed herein, the first wavelength light and the second wavelength light are blue and/or ultraviolet lights, and the first wavelength-converting layer and the second wavelength-converting layer are configured to be excited by blue and/or ultraviolet lights.

According to another embodiment disclosed herein, the second wavelength light is a green light while the fourth wavelength light is a red light.

According to another embodiment disclosed herein, the first substrate has a first thickness while the second substrate has a second thickness, and the first thickness is greater than the second thickness such that the first wavelength-converting layer has a greater height relative to the support board than the second wavelength-converting layer.

According to another embodiment disclosed herein, the support board has a first die bond area and a second die bond area.

According to another embodiment disclosed herein, the first light emitting diode and the second light emitting diode are located on the first die bond area.

According to another embodiment disclosed herein, the LED lighting module further includes a driver IC located on the second die bond area.

According to another embodiment disclosed herein, the LED lighting module further includes a first encapsulant body for sealing the first light emitting diode and the second light emitting diode.

According to another embodiment disclosed herein, the LED lighting module further includes a second encapsulant body for sealing the driver IC.

According to another embodiment disclosed herein, the first substrate and the second substrate are sapphire substrates.

According to another embodiment disclosed herein, the first thickness is two times greater than the second thickness, and a thickness difference between the first thickness and the second thickness is greater than 20 µm.

According to another embodiment disclosed herein, the first light emitting diode further comprises a first buffer layer located between the first substrate and the first light emitting layer stack, and the second light emitting diode further comprises a second buffer layer located between the second substrate and the second light emitting layer stack.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
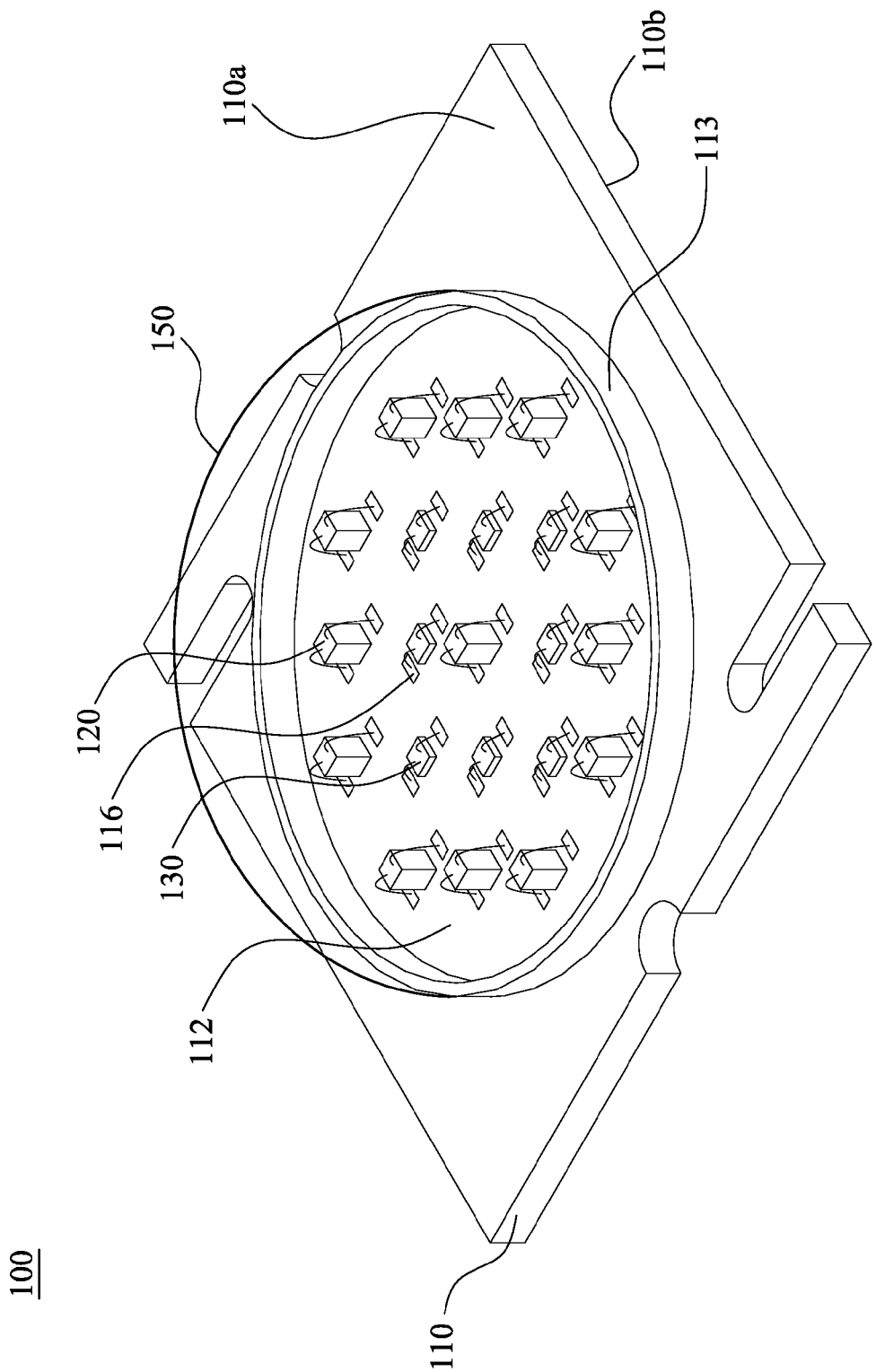
FIG. 1 illustrates a perspective view of a LED lighting module according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Regarding the terms "first", "second" etc. used herein, not specifically alleged order or pick, nor is it intended to limit the invention, they are used to distinguish technical terms to describe the same component or operation only.

In addition, the terms "coupled" or "connected" used herein may refer to two or more elements are in direct physical or electrical contact with each other or indirectly electrically connected with each other, but also refers to two or more elements, which interact with each other.

Figure 2:
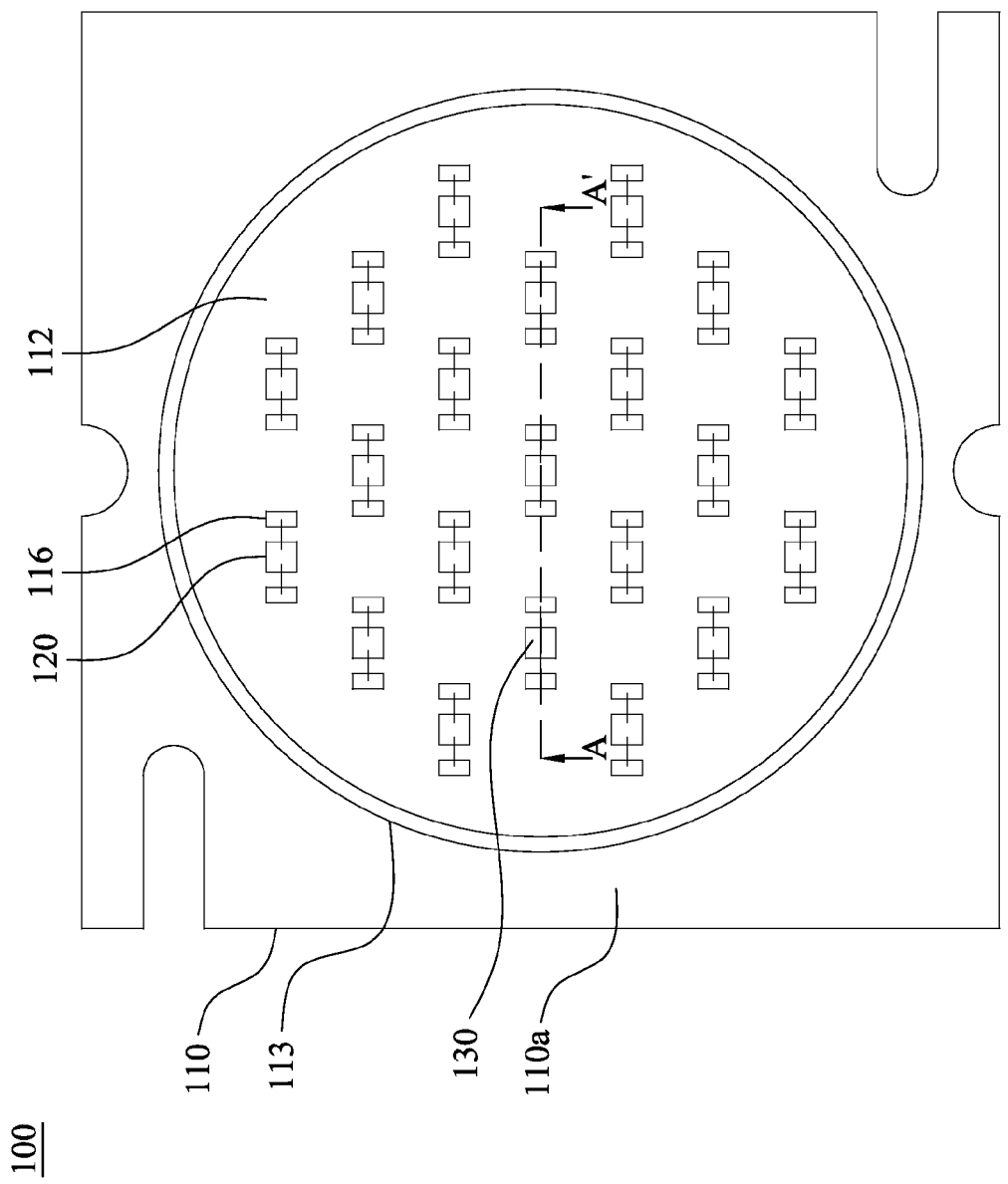
FIG. 2 illustrates a top view of the LED lighting module in FIG. 1.

FIG. 1 illustrates a perspective view of a LED lighting module according to one preferred embodiment of this invention, and FIG. 2 illustrates a top view of the LED lighting module in FIG. 1. Referring both to FIG. 1 and FIG. 2, a LED lighting module 100 includes a support board 110, first light emitting diodes 120 and second light emitting diodes 130. The support board 110 has an upper surface 110a and a lower surface 110b, which is opposite to the upper surface 110a. The first light emitting diodes 120 and the second light emitting diodes 130 are installed on the upper surface 110a. In this embodiment, the first light emitting diodes 120 and the second light emitting diodes 130 are of different thicknesses in order to avoid "light absorbance interference" occurred between the first light emitting diodes 120 and the second light emitting diodes 130.

In an embodiment, the upper surface 110a of the support board 110 includes a first die bond area 112, which is defined and surrounded by a rim frame 113. The first die bond area 112 also has multiple bonding pads 116. The first light emitting diodes 120 and the second light emitting diodes 130 are located within the first die bond area 112 and wire-bonded to the bonding pads 116 to achieve electrical connection.

In an embodiment, the LED lighting module 100 also includes a first encapsulant body 150 to cover and seal the first light emitting diodes 120 and the second light emitting diodes 130. The first encapsulant body 150 has a hemisphere-like profile.

Referring to FIG. 1, there are multiple first light emitting diodes 120 and second light emitting diodes 130, but not limited to any amount of light emitting diodes, e.g., a first light emitting diode 120 and a second light emitting diode 130 may be installed thereon.

Figure 3:
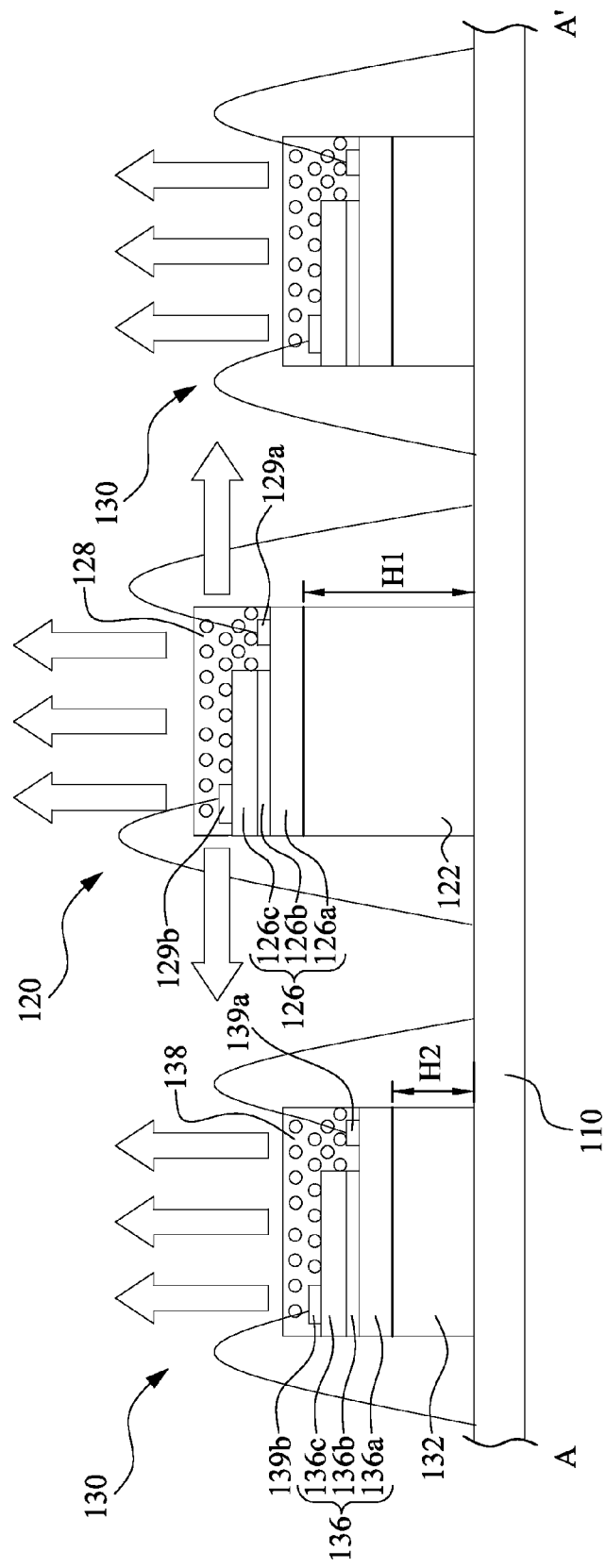
FIG. 3 illustrates a cross-sectional view of the LED lighting module taken along the line A-A' in FIG. 2.

FIG. 3 illustrates a cross-sectional view of the LED lighting module taken along the line A-A' in FIG. 2 to further illustrate more details for the first light emitting diodes 120 and the second light emitting diodes 130. Referring to FIG. 3, each first light emitting diode 120 includes a first substrate 122, a first light emitting layer stack 126 and a first wavelength-converting layer 128. In particular, the first substrate 122 is located on the upper surface 110a of the support board 110, the first light emitting layer stack 126 is located on the first substrate 122 and the first wavelength-converting layer 128 is located on the first light emitting layer stack 126. The first light emitting layer stack 126 still includes an n-type semiconductor layer 126a, an active layer 126b and a p-type semiconductor layer 126c, which are stacked sequentially. Moreover, each first light emitting diode 120 still includes an n-type electrode 129a and a p-type electrode 129b, wherein the n-type electrode 129a is located on the n-type semiconductor layer 126a and the p-type electrode 129b is located on the p-type semiconductor layer 126c. The first substrate 122 is a sapphire substrate. The n-type semiconductor layer 126a and the p-type semiconductor layer 126c are n-type doped nitride semiconductor layer and p-type nitride doped semiconductor layer respectively, and the nitride semiconductor layer can be GaN, AlGaN, InGaN or InGaAlN etc. The active layer 126b is a multiple quantum well (MQW) layer structure, and the first wavelength-converting layer 128 includes phosphor materials.

Referring to FIG. 3 again, each second light emitting diode 130 includes a second substrate 132, a second light emitting layer stack 136 and a second wavelength-converting layer 138. In particular, the second substrate 132 is located on the support board 110, the second light emitting layer stack 136 is located on the second substrate 132, and the second wavelength-converting layer 138 is located on the second light emitting layer stack 136. The second light emitting layer stack 136 includes an n-type semiconductor layer 136a, an active layer 136b, and a p-type semiconductor layer 136c stacked sequentially. Moreover, each second light emitting diode 130 still includes an n-type electrode 139a and a p-type electrode 139b, wherein the n-type electrode 139a is located on the n-type semiconductor layer 136a and the p-type electrode 139b is located on the p-type semiconductor layer 136c. The second substrate 132 is a sapphire substrate. The n-type semiconductor layer 136a and the p-type semiconductor layer 136c are n-type doped nitride semiconductor layer and p-type nitride doped semiconductor layer respectively, and the nitride semiconductor layer can be GaN, AlGaN, InGaN or InGaAlN etc. The active layer 136b is a multiple quantum well (MQW) layer structure, and the second wavelength-converting layer 138 includes phosphor materials.

Furthermore, the first light emitting layer stack 126 of the first light emitting diode 120 emits a first wavelength light and the first wavelength-converting layer 128 absorbs part of the first wavelength light and convert into a second wavelength light. The second light emitting layer stack 136 of the second light emitting diode 130 emits a third wavelength light, and the second wavelength-converting layer 138 absorb part of the third wavelength light and convert into a fourth wavelength light. In addition, a wavelength $\lambda 2$ of the second wavelength light is longer than a wavelength $\lambda 1$ of the first wavelength, a wavelength $\lambda 4$ of the fourth wavelength light is longer than a wavelength $\lambda 3$ of the third wavelength light, and a wavelength λ4 of the fourth wavelength light is longer than a wavelength λ2 of the second wavelength light.

For example, the LED lighting module 100 is used to provide a white lighting. The first wavelength light (with a wavelength λ1) emitted from the first light emitting layer stack 126 and the third wavelength light (with a wavelength λ3) emitted from the second light emitting layer stack 136 are both blue lights. The first wavelength-converting layer 128 can absorb part of the blue light emitted from the first light emitting layer stack 126 and convert into green light (i.e., the second wavelength light), and the second wavelength-converting layer 138 can absorb part of the blue light emitted from the second light emitting layer stack 136 and convert into red light (i.e., the fourth wavelength light) such that the red light, the green light and the remaining blue light can be mixed into a white light. In this embodiment, the first wavelength-converting layer 128 includes green phosphor materials while the second wavelength-converting layer 138 includes red phosphor materials.

In an embodiment as illustrated in FIG. 3, the first light emitting diode 120 has a greater thickness than the second light emitting diode 130 has in order to prevent the green light emitted from the first light emitting diode 120 from being absorbed by the second wavelength-converting layer 138 of the second light emitting diode 130.

Referring to FIG. 3 again, the first substrate of each first light emitting diode 120 has a first thickness H1 while the second substrate of each second light emitting diode 130 has second thickness H2, and the first thickness H1 is greater than the second thickness H2 to enable the first light emitting diode 120 to has a greater thickness than the second light emitting diode 130 has. In addition, the thickness difference between the first thickness H1 and the second thickness H2 also enables the first wavelength-converting layer 128 to have a greater height relative to the support board 110 than the second wavelength-converting layer 138. Therefore, the green light emitted from the first light emitting diode 120 is prevented from being absorbed by the second wavelength-converting layer 138 of the second light emitting diode 130 so as to generate a mixed white light with better color rendering (i.e., avoid the "light absorbance interference").

In an embodiment, the first thickness H1 is two times greater than the second thickness H2, and a thickness difference between the first thickness H1 and the second thickness H2 is greater than 20 μm.

Figure 4:
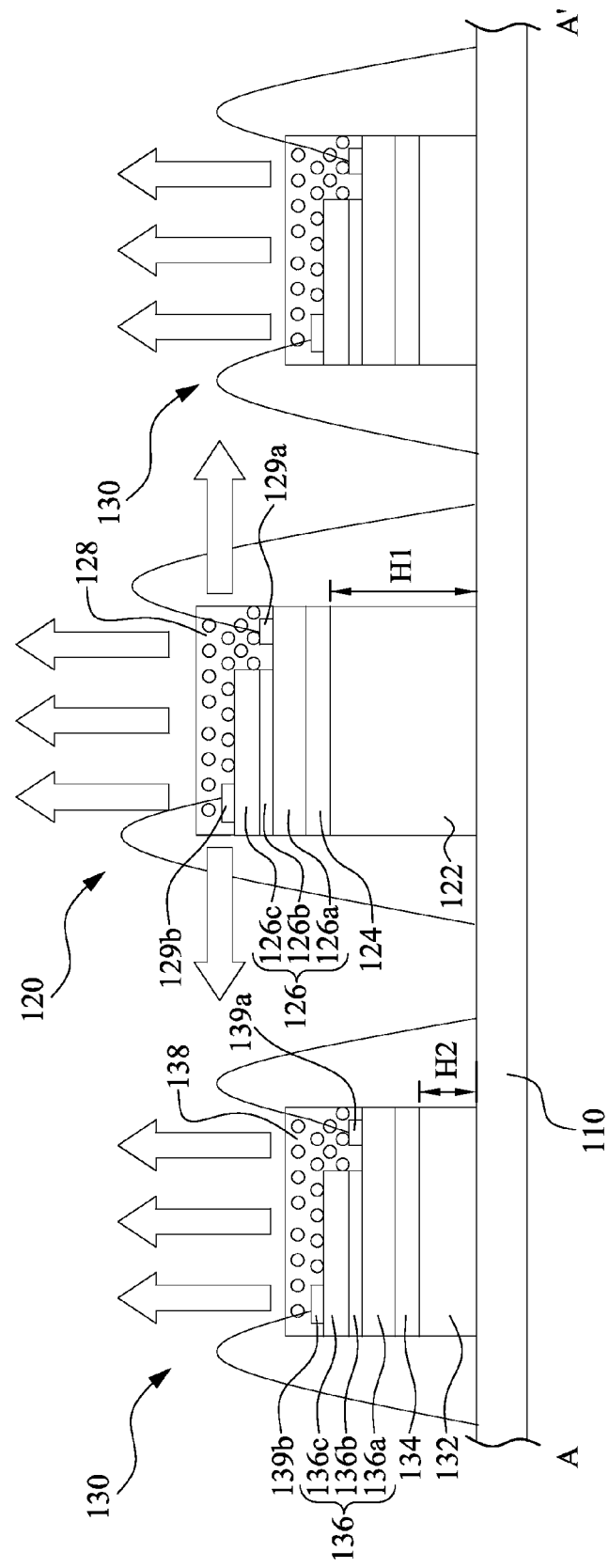
FIG. 4 illustrates a cross-sectional view of the LED lighting module according to another preferred embodiment of this invention.

FIG. 4 illustrates a cross-sectional view of the LED lighting module according to another preferred embodiment of this invention. Each first light emitting diode 120 further includes a first buffer layer 124 located between the first substrate 122 and the first light emitting layer stack 126 while each second light emitting diode 130 further includes a second buffer layer 134 located between the second substrate 132 and the second light emitting layer stack 136. In an embodiment, the first buffer layer 124 and the second buffer layer 134 are both undoped nitride semiconductor layers, e.g., GaN, AlGaN, InGaN or InGaAlN etc.

Figure 5:
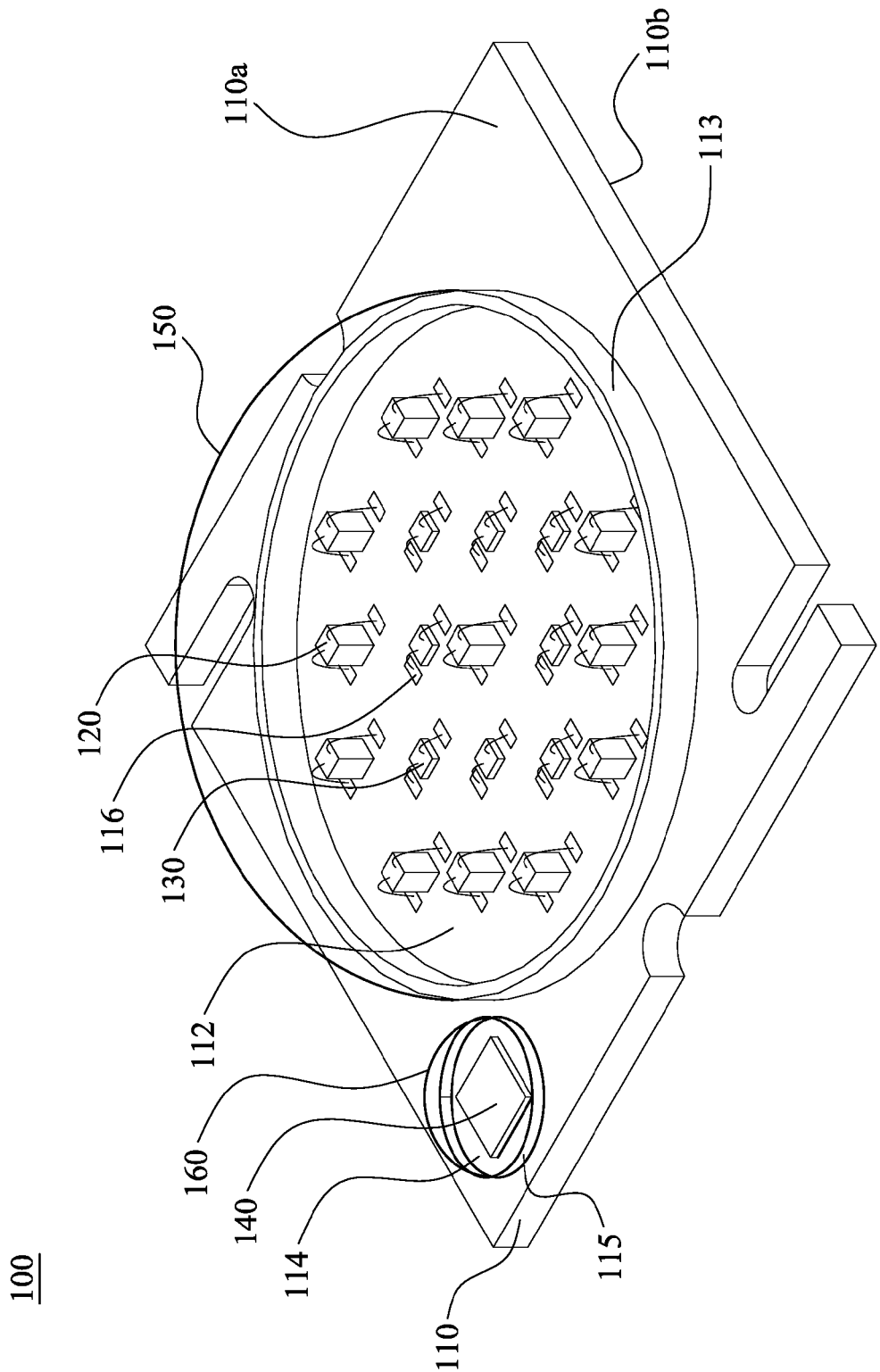
FIG. 5 illustrates a perspective view of a LED lighting module according to another preferred embodiment of this invention.

FIG. 5 illustrates a perspective view of a LED lighting module according to another preferred embodiment of this invention. The support board of the LED lighting module 100 further includes a second die bond area 114 on its upper surface 110a on which a driver IC 140 can be mounted. The second die bond area 114 is defined and surrounded by a rim frame 115. The driver IC 140 can be covered and sealed by a second encapsulant body 160. In an embodiment, the second encapsulant body 160 has a hemisphere-like profile.

Figure 6:
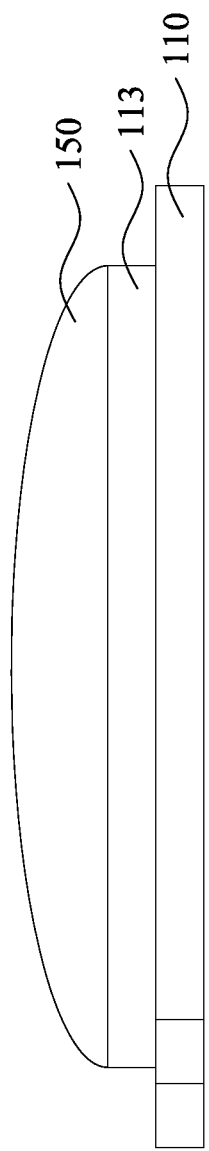
FIG. 6 illustrates a side view of the LED lighting module in FIG. 1.

FIG. 6 illustrates a side view of the LED lighting module in FIG. 1 to show a better side view for the hemisphere-like profile of the first encapsulant body 150.

Figure 7:
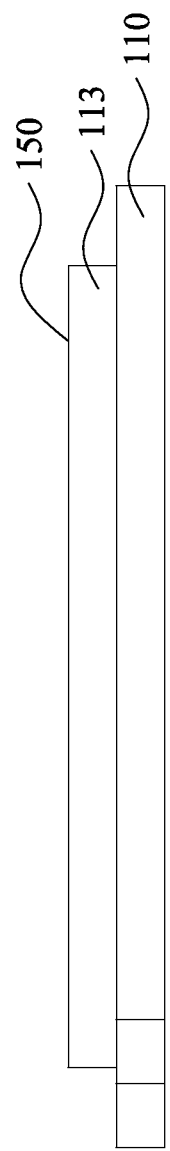
FIG. 7 illustrates a side view of the LED lighting module according to another preferred embodiment of this invention.

FIG. 7 illustrates a side view of the LED lighting module according to another preferred embodiment of this invention. In this embodiment, the first encapsulant body 150 has a flat-plate-like profile, which is different from the hemisphere-like profile illustrated in FIG. 6. In particular, the first encapsulant body 150 is filled within the first die bond area 112 to cover and seal the first light emitting diodes 120 and the second light emitting diodes 130 and does not protrude out of the rim frame 113. Similarly, the second encapsulant body 160 may be filled within the second die bond area 114 to cover and seal the driver IC 140, and does not protrude out of the rim frame 115.

In an embodiment, the first encapsulant body 150 and the second encapsulant body 160 can be epoxy resin, silicone resin or hybrid resin etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LED lighting module comprising:
   a support board having an upper surface and a lower surface opposite to the upper surface;
   a first light emitting diode disposed on an upper surface of the support board, and the first light emitting diode comprising a first substrate, a first light emitting layer stack and a first wavelength-converting layer, the first light emitting layer stack being disposed on the first substrate and configured to emit a first wavelength light, the first wavelength- convertin layer being disposed on the first light emitting layer stack and configured to absorb part of the first wavelength light and convert into a second wavelength light; and
   a second light emitting diode disposed on the upper surface of the support board, and the second light emitting diode comprising a second substrate, a second light emitting layer stack and a second wavelength-converting layer, the second light emitting layer stack being disposed on the second substrate and configured to emit a third wavelength light, the second wavelength-converting layer being disposed on the second light emitting layer stack and configured to absorb part of the third wavelength light and convert into a fourth wavelength light;
   wherein the total thickness of the first light emitting diode is different from the total thickness of the second light emitting diode.

2. The LED lighting module of claim 1, wherein the second wavelength light has a longer wavelength than the first wavelength light has, the fourth wavelength light has a longer wavelength than the third wavelength light has, and the fourth wavelength light has a longer wavelength than the second wavelength light has.

3. The LED lighting module of claim 2, wherein the first wavelength light and the second wavelength light are blue and/or ultraviolet lights, and the first wavelength-converting layer and the second wavelength-converting layer are configured to be excited by blue and/or ultraviolet lights.

4. The LED lighting module of claim 3, wherein the second wavelength light is a green light while the fourth wavelength light is a red light.

5. The LED lighting module of claim 3, wherein the first substrate has a first thickness while the second substrate has a second thickness, and the first thickness is greater than the second thickness such that the first wavelength-converting layer has a greater height relative to the support board than the second wavelength-converting layer.

6. The LED lighting module of claim 5, wherein the first thickness is two times greater than the second thickness, and a thickness difference between the first thickness and the second thickness is greater than 20 μm.

7. The LED lighting module of claim 1, wherein the support board has a first die bond area and a second die bond area.

8. The LED lighting module of claim 7, wherein the first light emitting diode and the second light emitting diode are disposed on the first die bond area.

9. The LED lighting module of claim 7 further comprising a driver IC disposed on the second die bond area.

10. The LED lighting module of claim 8 further comprising a first encapsulant body for sealing the first light emitting diode and the second light emitting diode.

11. The LED lighting module of claim 9 further comprising a second encapsulant body for sealing the driver IC.

12. The LED lighting module of claim 1, wherein the first substrate and the second substrate are sapphire substrates.

13. The LED lighting module of claim 1, wherein the first light emitting diode further comprises a first buffer layer disposed between the first substrate and the first light emitting layer stack, and the second light emitting diode further comprises a second buffer layer disposed between the second substrate and the second light emitting layer stack.

* * * * *